Sept. 26, 1961 R. J. CARROZZA ET AL 3,001,786

PRINTED CIRCUIT PRINTING MACHINE

Filed Aug. 26, 1957 13 Sheets-Sheet 1

INVENTORS.
Roy J. Carrozza
Joseph W. Campagna
Stanley J. Potocki

By J. W. Douglas
Their ATTORNEY

Sept. 26, 1961 R. J. CARROZZA ET AL 3,001,786

PRINTED CIRCUIT PRINTING MACHINE

Filed Aug. 26, 1957 13 Sheets-Sheet 2

INVENTORS.
Roy J. Carrozza
Joseph W. Campagna
Stanley J. Potocki

By J. W. Douglas
Their ATTORNEY

Sept. 26, 1961 R. J. CARROZZA ET AL 3,001,786

PRINTED CIRCUIT PRINTING MACHINE

Filed Aug. 26, 1957 13 Sheets-Sheet 3

INVENTORS.
Roy J. Carrozza
Joseph W. Campagna
Stanley J. Potocki

By [signature]
ATTORNEY

Sept. 26, 1961 R. J. CARROZZA ET AL 3,001,786

PRINTED CIRCUIT PRINTING MACHINE

Filed Aug. 26, 1957 13 Sheets-Sheet 4

INVENTORS.
Roy J. Carrozza
Joseph W. Campagna
Stanley J. Potocki

By [signature]
their ATTORNEY

Sept. 26, 1961 R. J. CARROZZA ET AL 3,001,786

PRINTED CIRCUIT PRINTING MACHINE

Filed Aug. 26, 1957 13 Sheets-Sheet 5

INVENTOR.
Roy J. Carrozza
Joseph W. Campagna
Stanley J. Potocki
By J. D. Douglas
their ATTORNEY Sept. 26, 1961 R. J. CARROZZA ET AL 3,001,786

PRINTED CIRCUIT PRINTING MACHINE

Filed Aug. 26, 1957 13 Sheets-Sheet 6

INVENTORS:
Roy J. Carrozza
Joseph W. Campagna
Stanley J. Potocki

By J. D. Douglas
His ATTORNEY

Sept. 26, 1961 R. J. CARROZZA ET AL 3,001,786

PRINTED CIRCUIT PRINTING MACHINE

Filed Aug. 26, 1957 13 Sheets-Sheet 7

INVENTORS.
Roy J. Carrozza
Joseph W. Campagna
Stanley J. Potocki

By J. D. Douglas
Their ATTORNEY

PRINTED CIRCUIT PRINTING MACHINE

INVENTORS.
Roy J. Carrozza
Joseph W. Campagna
Stanley J. Potocki
By
ATTORNEY

Sept. 26, 1961 R. J. CARROZZA ET AL 3,001,786

PRINTED CIRCUIT PRINTING MACHINE

Filed Aug. 26, 1957 13 Sheets-Sheet 9

INVENTORS.
Roy J. Carrozza
Joseph W. Campagna
Stanley J. Potocki
By J. D. Douglas
their ATTORNEY INVENTORS.
Roy J. Carrozza
Joseph W. Campagna
Stanley J. Potocki
By J. D. Douglass
their ATTORNEY Sept. 26, 1961 R. J. CARROZZA ET AL 3,001,786

PRINTED CIRCUIT PRINTING MACHINE

Filed Aug. 26, 1957 13 Sheets-Sheet 11

INVENTORS.
Roy J. Carrozza
Josesph W. Campagna
Stanley J. Potocki

By J. D. Douglas
their ATTORNEY

Sept. 26, 1961 R. J. CARROZZA ET AL 3,001,786

PRINTED CIRCUIT PRINTING MACHINE

Filed Aug. 26, 1957 13 Sheets-Sheet 12

INVENTORS:
Roy J. Carrozza
Joseph W. Campagna
Stanley J. Potocki
By J. D. Douglas
their ATTORNEY INVENTORS.
Roy J. Carrozza
Joseph W. Campagna
Stanley J. Potocki
By J. U. Dreyfuss
ATTORNEY 3,001,786

United States Patent Office

Patented Sept. 26, 1961

3,001,786

PRINTED CIRCUIT PRINTING MACHINE

Roy J. Carrozza and Stanley J. Potocki, Chicago, and Joseph W. Campagna, Berwyn, Ill., assignors to Admiral Corporation, Chicago, Ill., a corporation of Delaware Filed Aug. 26, 1957, Ser. No. 680,277
1 Claim. (Cl. 271—44)

The present invention relates to printing presses of the type used for so-called silk screen printing. In particular it comprehends a machine for printing on plate-like blanks and includes a magazine to contain the blanks, means to remove the blanks in one-by-one order from the magazine and pass them to a printing station from which said means removes them after they have been printed to then discharge them from the machine, all of the operations being carried out automatically and in timed sequence or should it be desired in an order determined by an operator of the machine.

The printing press herein described is particularly useful for rapidly carrying out one of the steps in manufacture of printed circuit blanks or boards used in the electronic industry and is an improvement over a related type of apparatus described in an application filed in the name of Frederick H. Scheeler on November 28, 1956, Serial No. 624,823. Besides printing circuit indicia on the uniform metallic surfaces of blanks preparatory to formation of conductors thereon by removal of unprinted metal of the surfaces, printing of solder resisting liquids, such as silicone compounds, on localized regions of the blanks on which the conductors are already formed, preparatory to localized soldering of the conductors, is also contemplated.

Other advantages of the invention will be set forth in part hereinafter and in part will be obvious herefrom, or may be learned by practice from the invention, the same being realized and attained by means of the instrumentalities and combinations pointed out in this specification and claimed in the appended claim.

The accompanying drawings, referred to herein, and constituting a part hereof, illustrate at least one embodiment of the invention, and together with the description, serve to explain the principles of the invention.

Figures 2, 3:
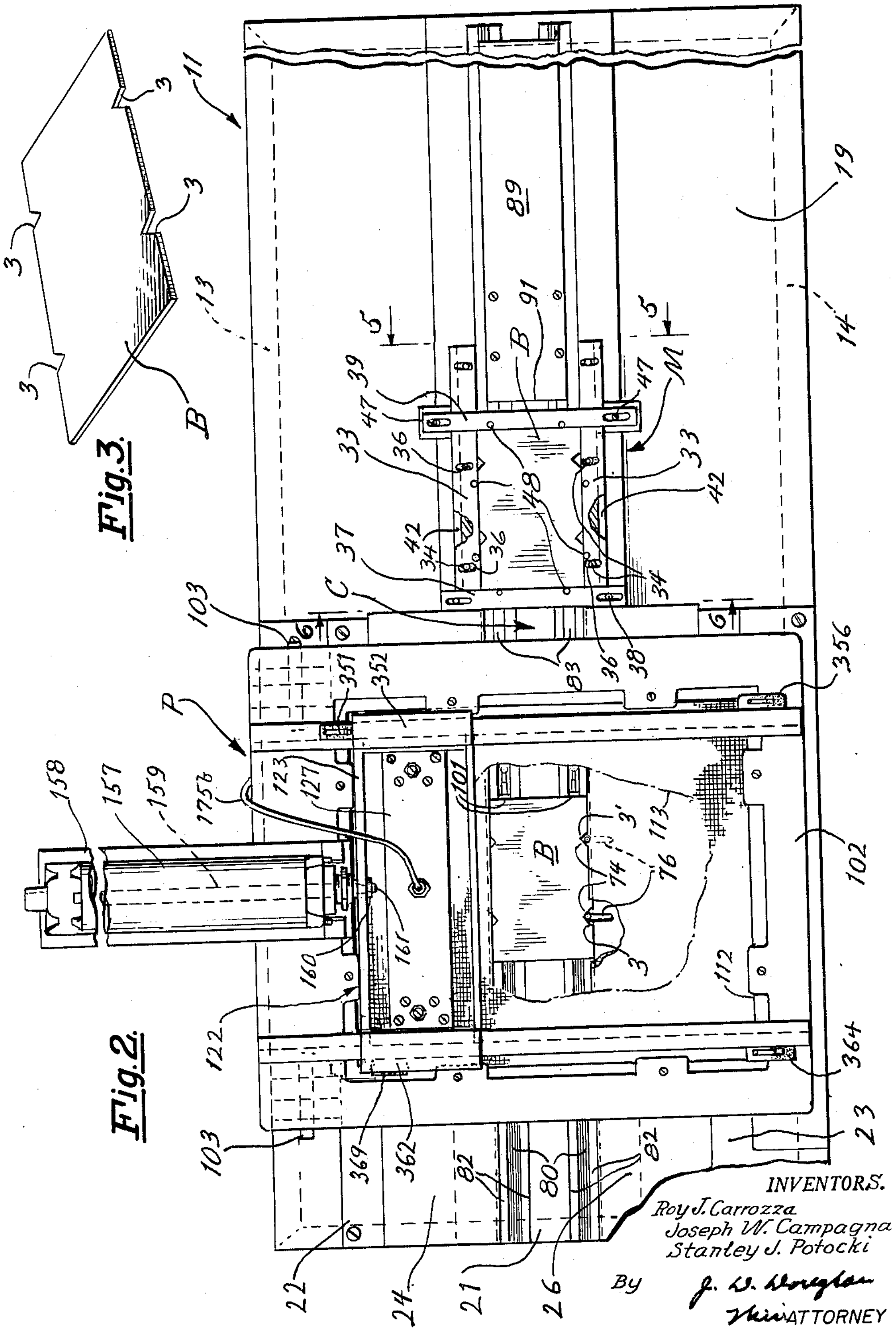
FIG. 2 is a top plan view of the machine shown in FIG. 1, parts thereof being broken away.
FIG. 3 is a perspective view of a typical blank on which printing is effected by the machine shown in FIG. 1.
Figures 7, 8, 8A, 9:
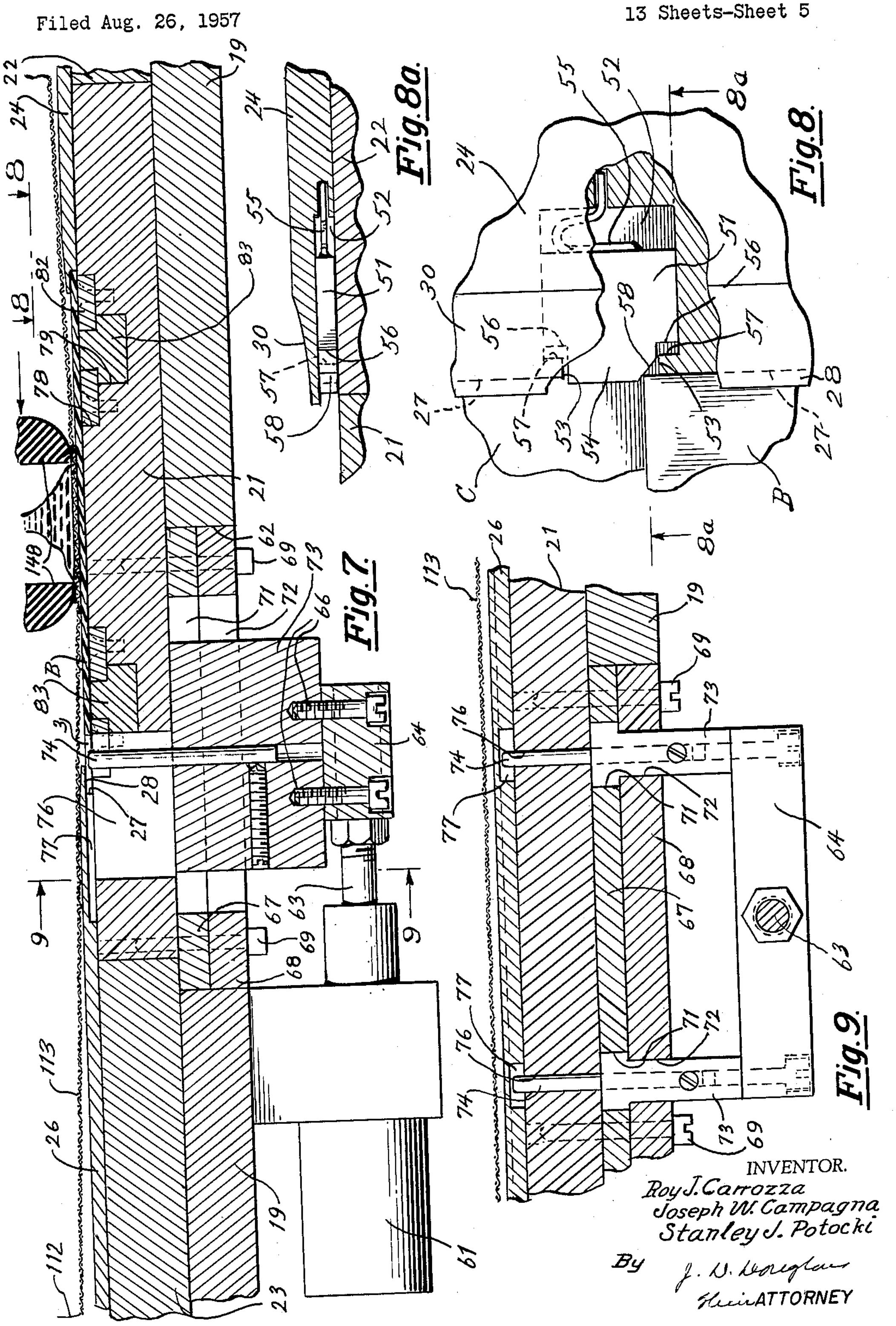
FIG. 7 is a fragmentary vertical section, taken on line 7—7 of FIG. 1.
FIG. 8 is a fragmentary plan view, the location of which is indicated by line 8—8 of FIG. 7, the screen having been removed.
Figures 10, 12:
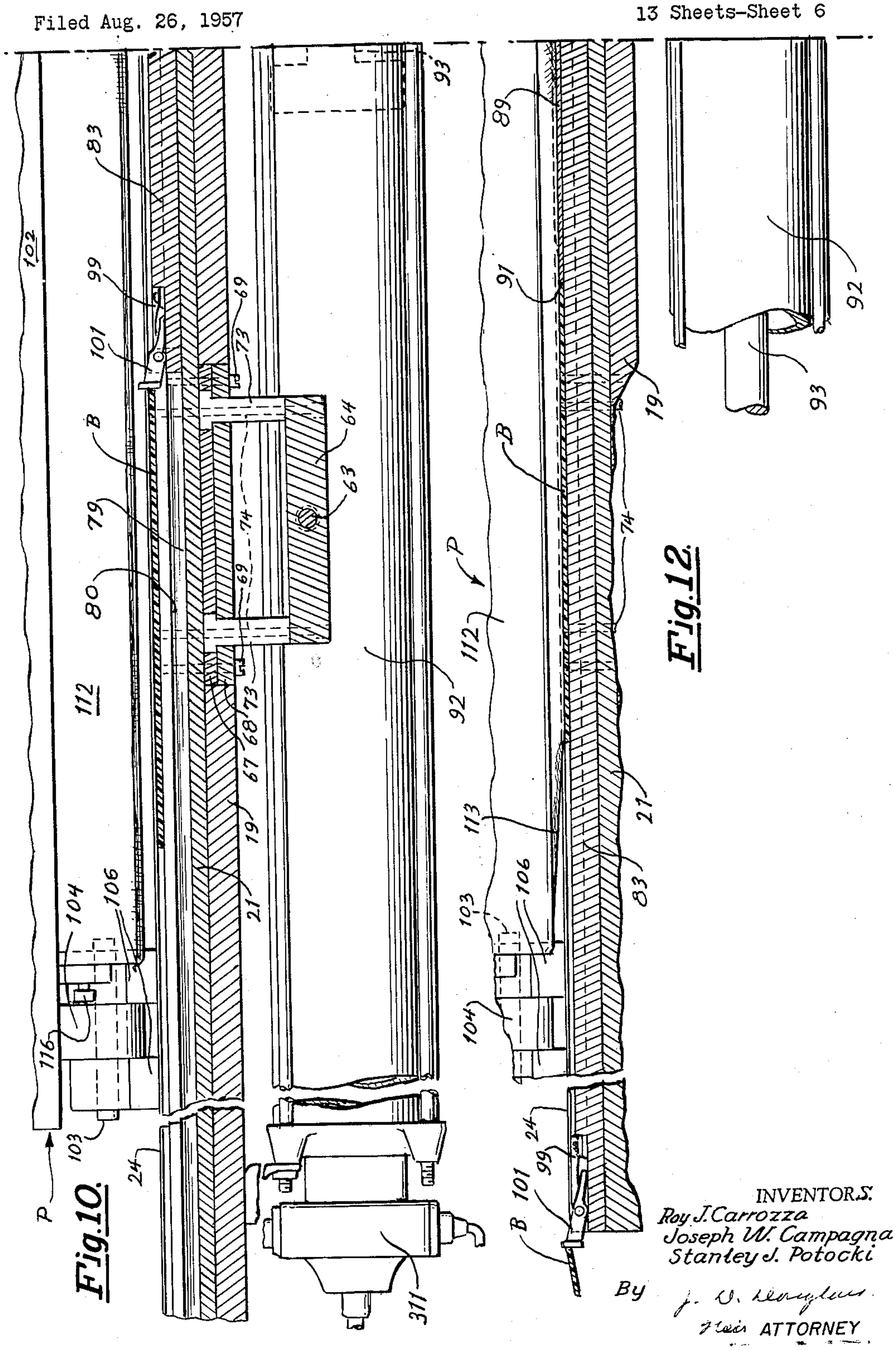
Figures 11, 13:
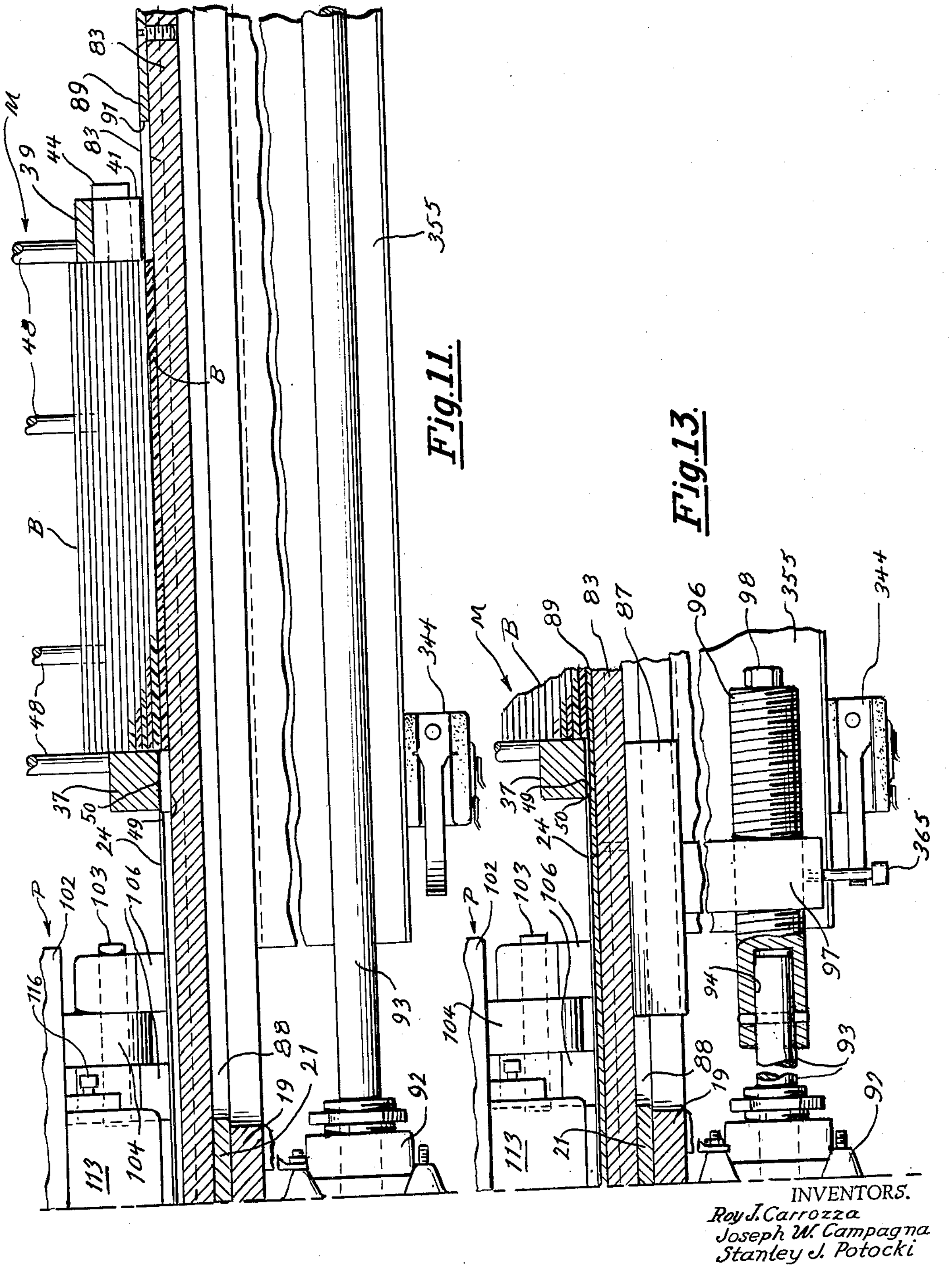
Figures 14, 15, 16:
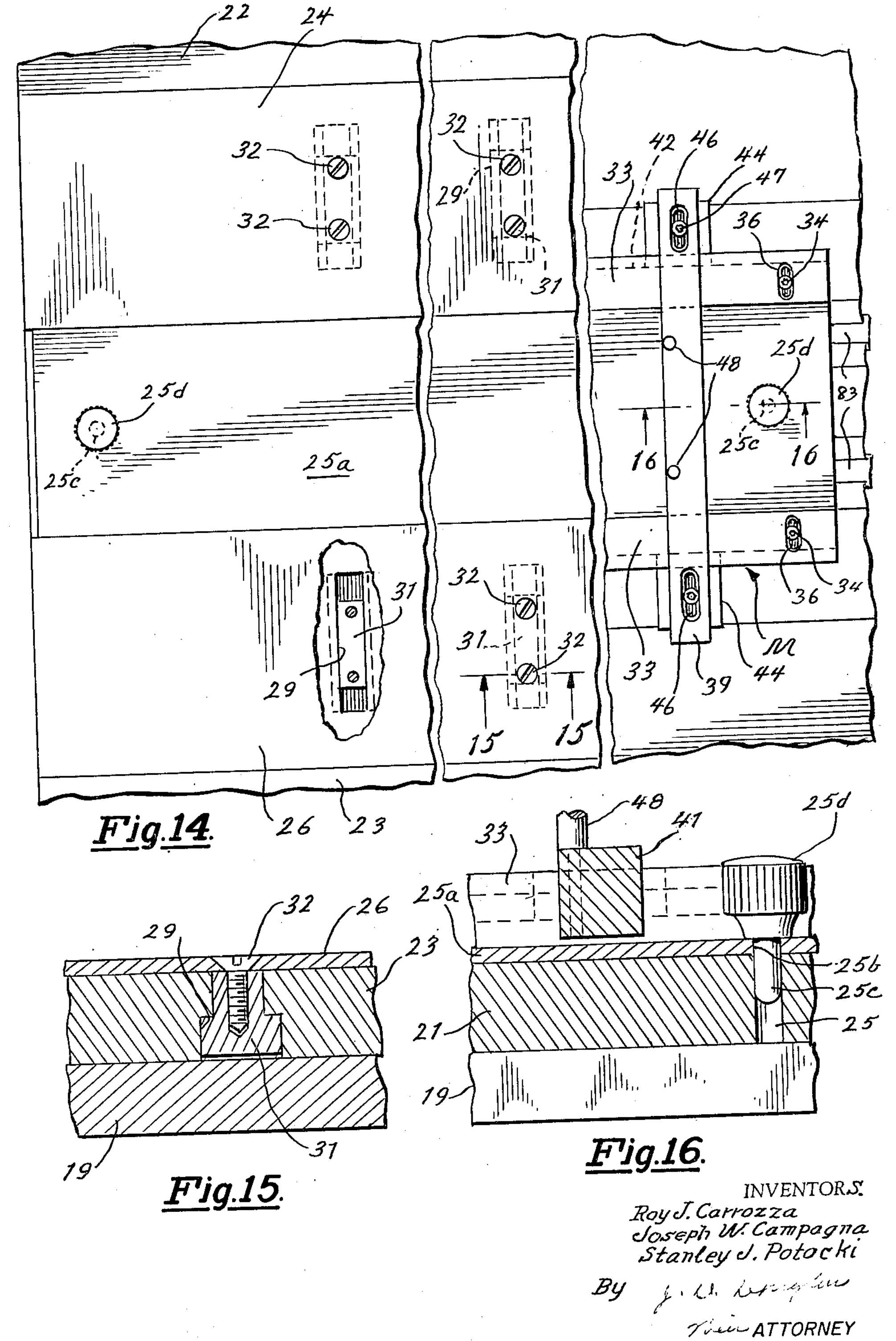
Figure 17:
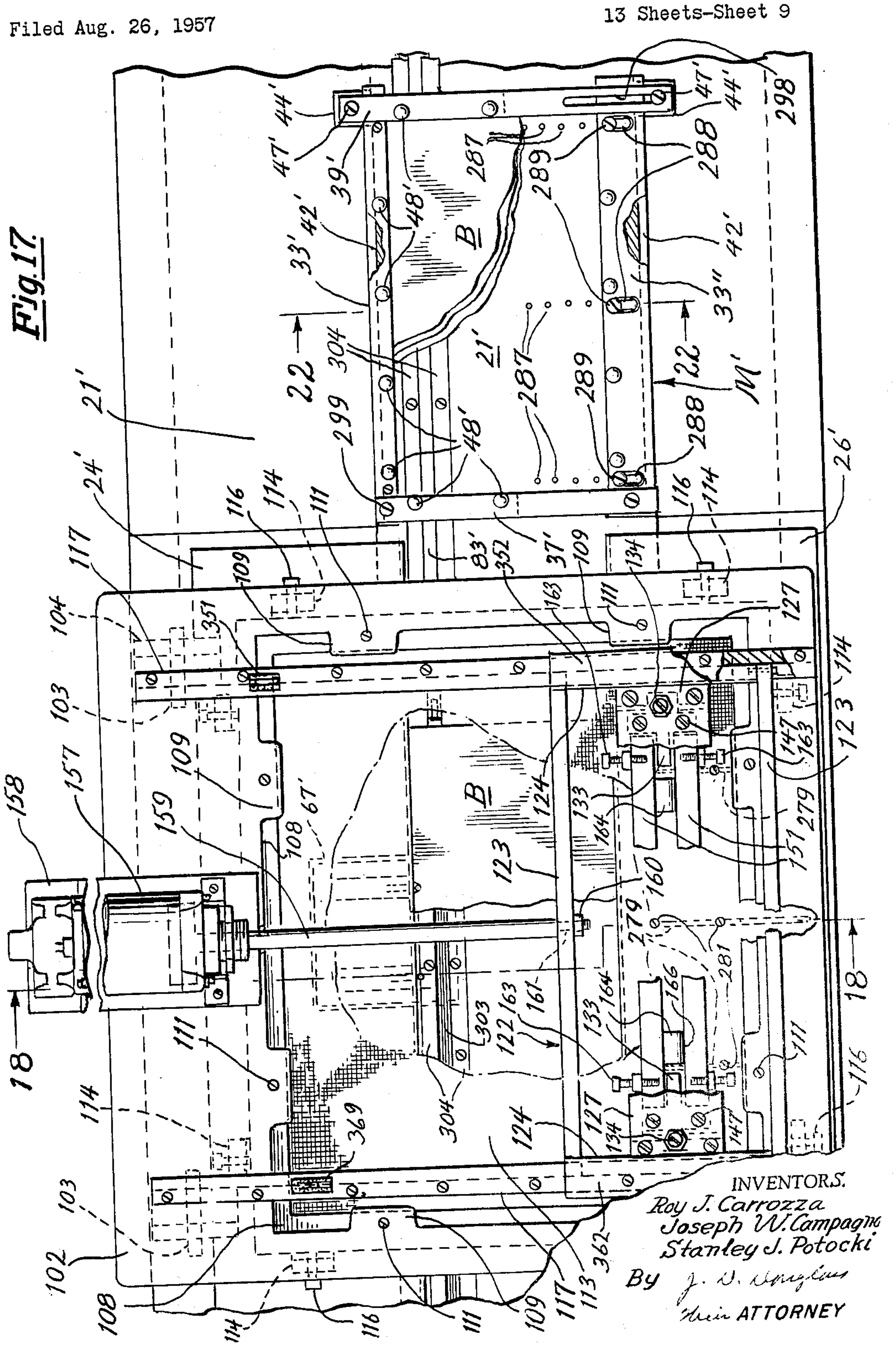
Figure 18:
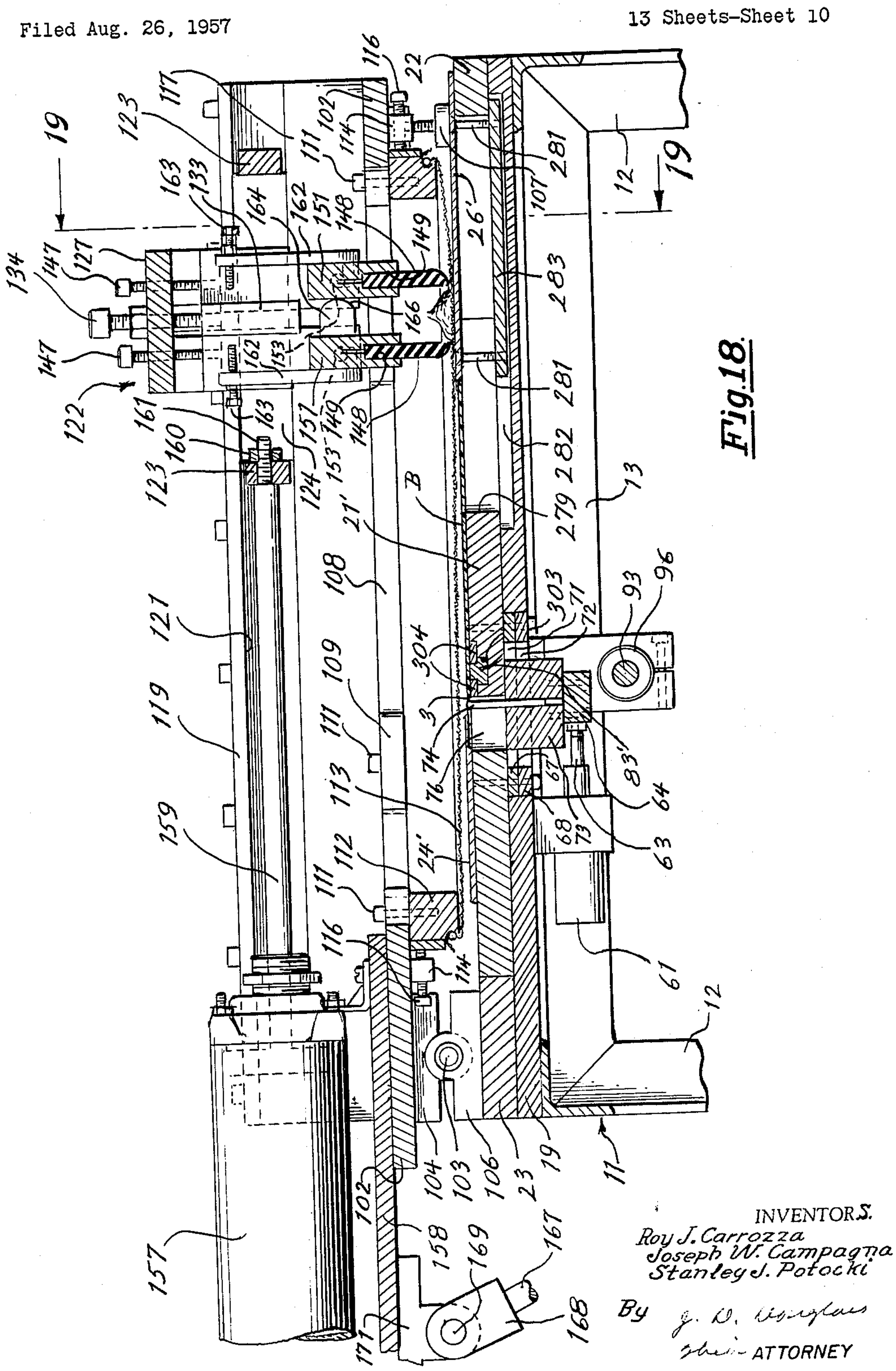
Figures 19, 20, 21:
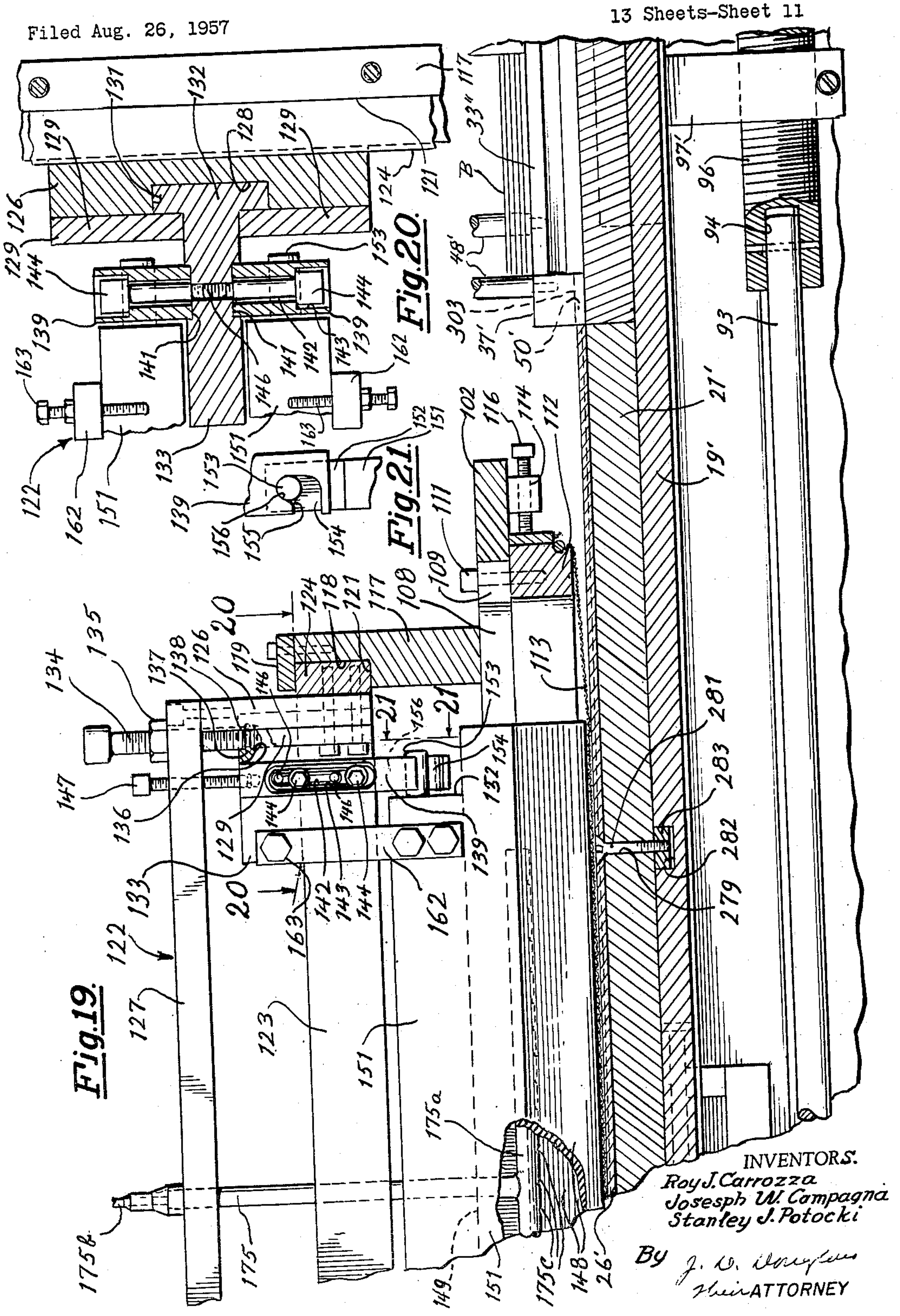
Figure 22:
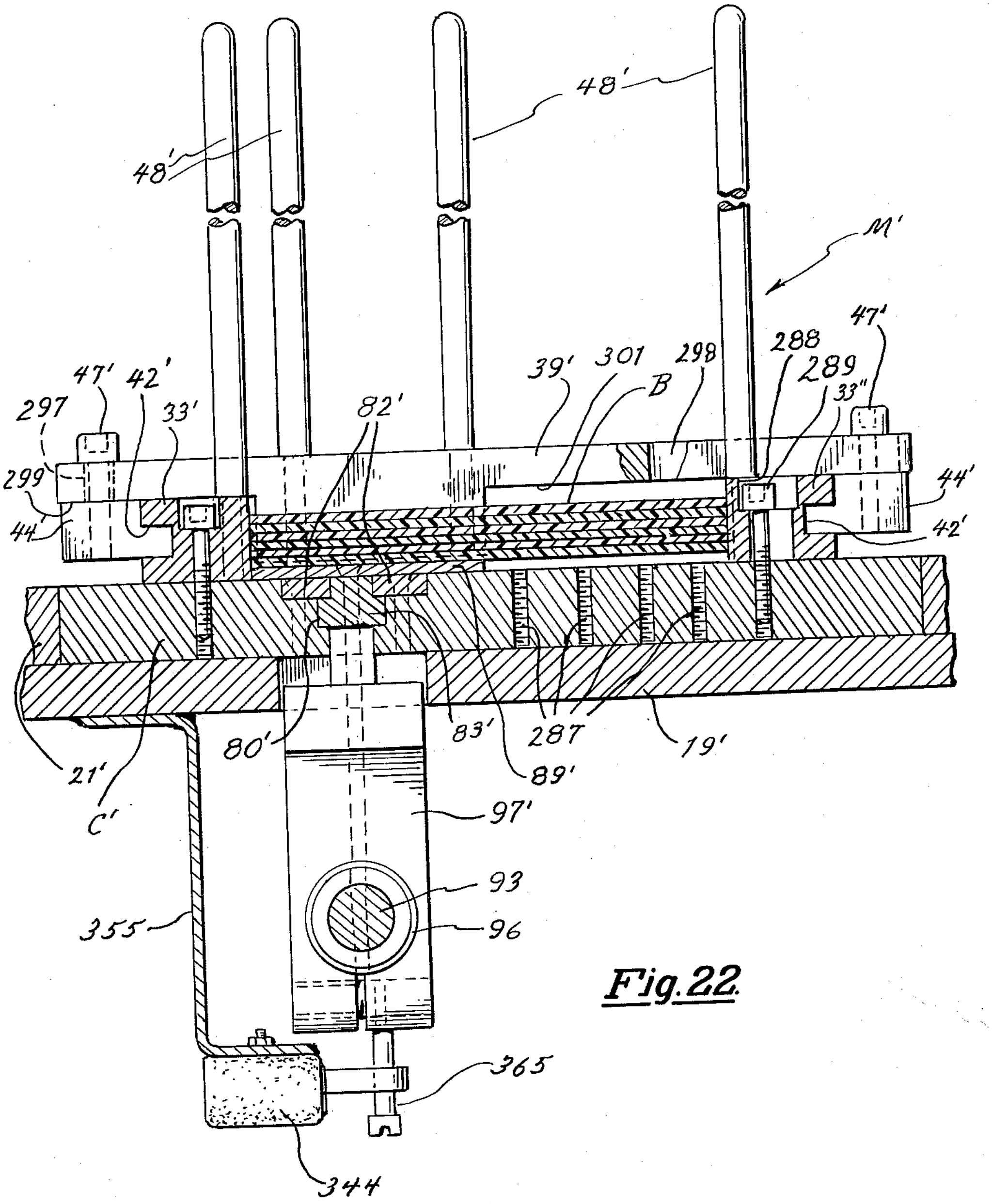

FIG. 8*a* is a vertical section taken on line 8*a*—8*a* of FIG. 8;

FIG. 9 is a fragmentary vertical section taken on line 9—9 of FIG. 7;

FIG. 10 is a fragmentary vertical section taken on line 10—10 of FIG. 2;

FIG. 11 is a continuation of the right hand end of the parts shown in FIG. 10;

FIG. 12 is also a sectional view corresponding to FIG. 10, parts being in another position;

FIG. 13 is a continuation of the right hand end of FIG. 12;

FIG. 14 is a fragmentary top plan view, drawn to an enlarged scale, of parts shown in FIG. 2, parts being broken away;

FIG. 15 is a vertical section taken on line 15—15 of FIG. 14;

FIG. 16 is a vertical section taken on line 16—16 of FIG. 14;

FIG. 17 is a fragmentary top plan view of a second embodiment of the invention, the ink rail having been removed;

FIG. 18 is a fragmentary vertical section taken on line 18—18 of FIG. 17;

FIG. 19 is a fragmentary vertical section taken on line 19—19 of FIG. 18;

FIG. 20 is a horizontal section taken on line 20—20 of FIG. 19;

FIG. 21 is a fragmentary elevational view, the location of which is indicated by line 21—21 of FIG. 19;

FIG. 22 is a vertical section taken on line 22—22 of FIG. 17; and

Figure 23:
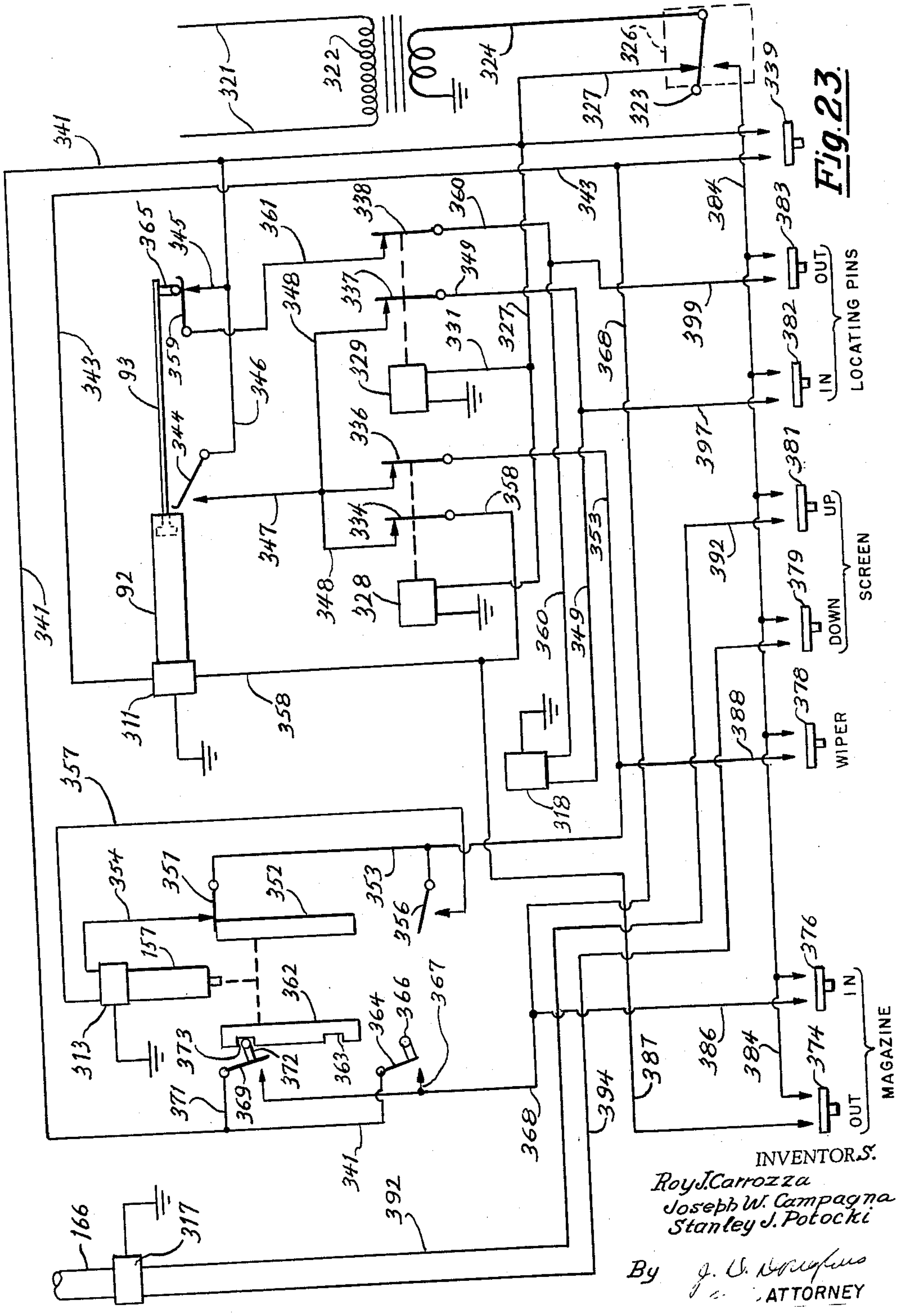

FIG. 23 is a circuit diagram of the electrical controls for the machine.

In FIG. 3 is indicated a typical plate-like blank or board B on which printing impressions may be made by the novel printing press about to be described. The blank B may be rectangular or square, is preferably of Bakelite about 1/16 of an inch in thickness and one of its flat surfaces is formed with a coating of metallic copper bonded to the Bakelite to receive printed indicia. The printing thus effected, is one of the steps in manufacture of printed circuits for electronic equipment such as used in radio or television apparatus. Other steps in manufacture of the circuits will not be described, since they are in no way related to the present invention. Nor will the structure of a novel screen frame for use in the machine be described, since the frame forms the subject matter of a co-pending application filed in the name of Frederick H. Scheeler on November 8, 1955, Serial No. 545,730.

The printing press itself includes a frame 11 of rectangular horizontal section defined by vertical corner members 12, upper horizontal members 13 and 14, lower hroizontal members 16 and 17, and vertical, intermediate or reinforcing members 18. The members 12—18 are preferably of steel angle iron, secured together by welding to each other. The frame 11 also includes a top provided by a metal plate or fixed base plate 19 fixed to the members 13 and 14.

Mechanisms supported by the frame 11 include a magazine M and a printing mechanism P, both of which will be described in detail hereinafter. A supply of printed circuit blanks B are stacked in superimposed relation to each other in the magazine M from which they are ejected in one-by-one order and transferred to the printing mechanism P by being slid through a course now to be described. To understand how the course is provided, it should be noted that an impression plate or bed 21, FIG. 7, extends longitudinally of the plate 19 to which the bed is rigidly secured. The bed 21 is of width less than the width of the frame 11 and arranged between a pair of filler plates 22 and 23, coplanar with the bed from which they extend flush with the longitudinal sides of the frame. Like the impression plate 21, the plates 22 and 23 are fixed to the plate 19 and afford support for a pair of uniformly spaced guide plates 24 and 26 of thickness slightly greater than the thickness of a printed circuit blank B. Adjacent edge portions of the plates 24 and 26 are of similar inverted L-shaped formation throughout their respective lengths to provide vertical walls 27 and over-hanging edges 28 spaced minutely more than the thickness of a blank from the bed 21. The plates 24 and 26 are releasably clamped to the bed at such a distance from each other that a blank may be accommodated between the vertical walls 27 while the edges 28 extend over the marginal edges of the blank to confine it in intimate association with the bed 21. A blank which is normally bowed longitudinally is therefore substantially straight when pressed against the bed by the edge 28. It will now be understood that the guides 24 and 26 provide a linear course C for blanks to be slidably moved in throughout the length of the guides. Additionally, it should be noted that the course extends under the printing mechanism P.

The width of the course C may be varied to accommodate a blank of selected width. For this feature, the filler plates 22 and 23 are formed with a plurality of T-slots 29, FIGS. 14 and 15, extending transversely thereof. A nut 31 of inverted T-shaped cross-section is received in each of the T-slots and a pair of screws 32, passing freely through the guides 24 and 26 above each of the slots, is threaded in each of the nuts 31. It will therefore be apparent that on loosening the screws 32 the nuts 31 may be moved longitudinally of the slots 29 in order that the plates 24 and 26 may be moved laterally until a position suitable for accommodation of a selected blank between the plates has been found after which the screws are tightened.

Once the guide plates 24 and 26 are loosened from the bed 21, preparatory to accommodation therebetween of a blank having a different width, it is desirable that the plates be again clamped to the bed in symmetrical relation to the axis thereof. To facilitate this operation and provide accuracy in the new location of the plates, a locating hole 25 is provided at either end of the bed 21 on the axis thereof. A metal gauge plate 25a, of length adequate to extend over the holes 25 and equal in width and thickness to the new blank to be printed, is provided and has at its ends, holes 25b arranged for registration with the holes 25 so that a gauge pin 25c, FIG. 16, may concurrently extend through each of the holes 25b and into the holes 25. If desired, the pins 25c may have knurled handles 25d to facilitate their manipulation. After the pins 25c have been inserted, as indicated, the walls 27 of the guide plates 24 and 26 are brought into engagement with opposite edges of the gauge plate and clamped to the bed 21. Then the gauge plate is removed. Additional gauge plates may be provided for each size of blank used, the respective gauge plates having holes at their axes by which they may be temporarily pinned to the bed until the screws 32 are tightened.

Figure 1:
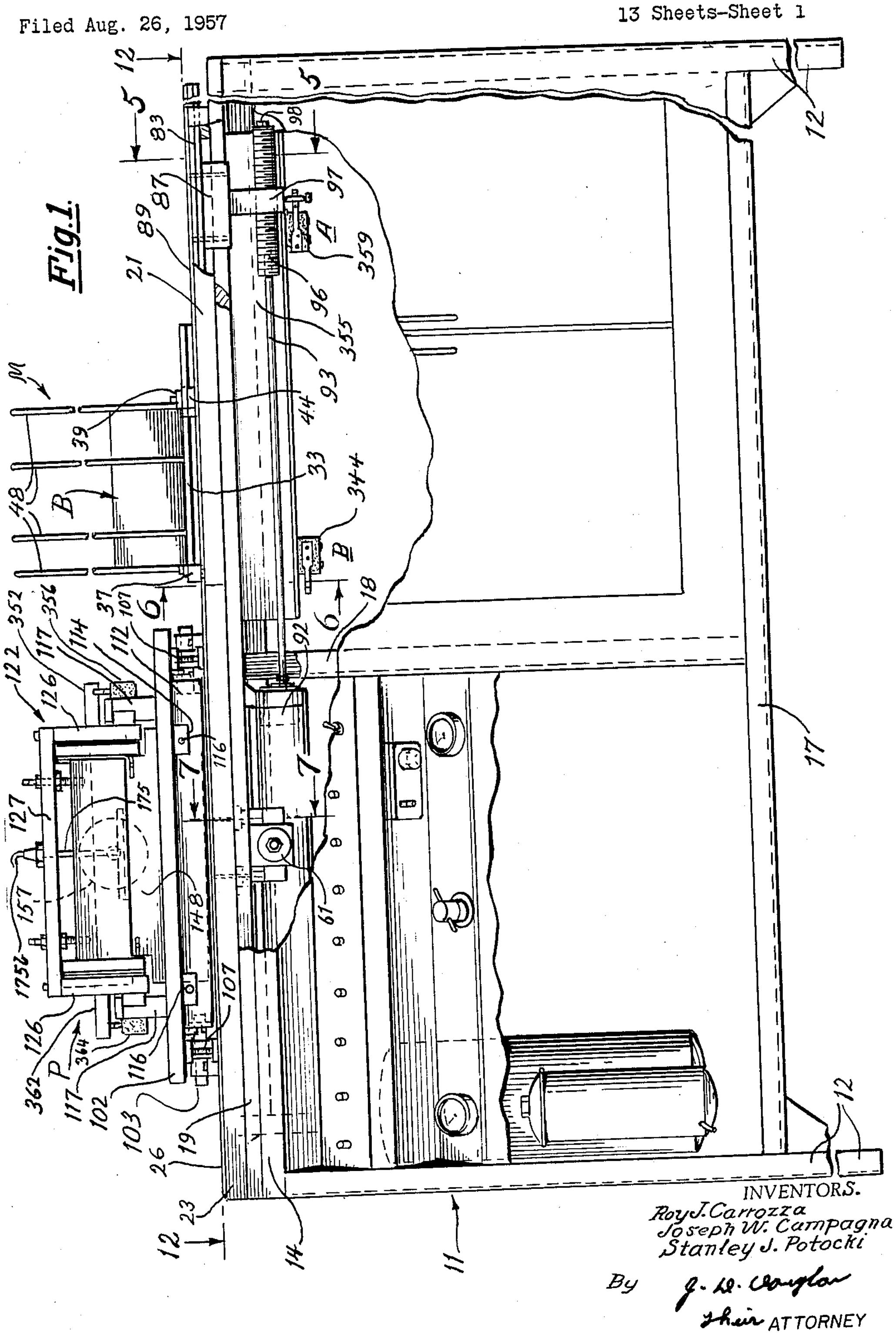
FIG. 1 is a side elevational view of the machine in which the invention is incorporated, certain parts thereof being broken away to illustrate otherwise hidden structure.

At one end of the course C is the magazine M, FIGS. 1 and 2. It comprises a pair of side bars 33, FIG. 5, extending longitudinally of the bed to which the bars are anchored by screws 34 passing freely through slots 36, FIG. 14, transversely of the bars. For the bars to accommodate blanks B of given width between them, the screws 34 may be loosened and the bars shifted laterally thereof away from each other. A gauge plate 25a, equal in width to the width of the blank desired to be printed, is temporarily arranged on the bed 21, as previously described, the rails are then brought into intimate engagement with the plate 25a after which the screws 34 are tightened and the gauge plate removed. The side bars 33 extend from a front or gate bar 37, FIG. 6, transversely of the bed 21, to which the bar 37 is secured by screws 38, FIG. 2. Remote from the bar 37, a distance slightly greater than the length of a blank that the magazine is adjusted to receive, is a rear bar 39, FIG. 5, disposed parallel to the front bar. The side bars 33 are superimposed by the bar 39 and at their junctions the bar 39 is of reduced thickness, as shown, to provide a central portion or rear wall 41 of length less than the width of the narrowest blank to be accommodated by the magazine. When the bar 39 is clamped to the bars 33, by means later to be indicated, the bottom of the wall 41 is spaced from the bed 21 by more than the thickness of one blank, but less than the combined thickness of two blanks.

In order that the rear bar 39 may be clamped to the side bars 33, each of the latter is formed with a groove 42 throughout the length of its vertical side, outwardly of the magazine, to receive a flange or tongue 43 on each of a plurality of clamp blocks or nuts 44. Both of the end portions of the bar 39 are formed with slots 46 to freely receive the shank portions of screws 47 threaded in the blocks 44. On loosening the screws 47 the bar 39 may be slid laterally thereof guided by the cooperating grooves 42 and flanges 43 until the bar 39 is spaced at a selected distance from the bar 37 to accommodate the length of a given blank. Then the screws 47 are tightened to clamp the bar 39 to the bars 33. The bottom of a stack of magazined blanks are therefore received in the space defined by the pair of bars 33 and bars 39 and 37. Above the level of these bars, the blanks are retained against possible edgewise displacement by vertical fence rods 48, at least one of which extends upward from each of the bars 33, 37 and 39.

Figures 5, 6:
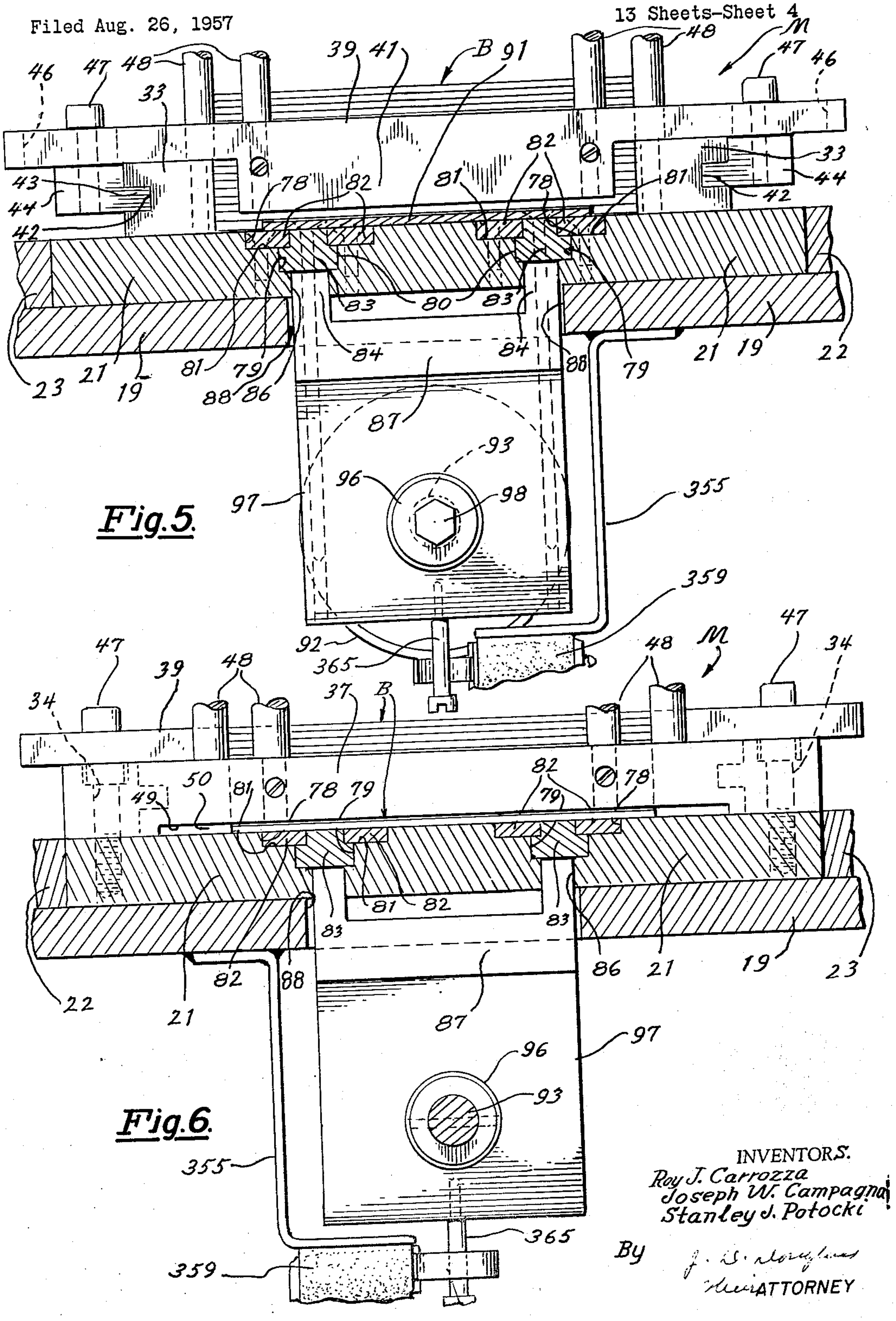
FIG. 5 is a fragmentary vertical section on line 5—5 of FIG. 2, drawn to an enlarged scale.
FIG. 6 is a fragmentary vertical section taken on line 6—6 of FIG. 2.

The blanks are removed from the magazine by sliding the lowest magazined blank out from under the remaining blanks. For this to be effected, the bottom of the front bar 37, FIG. 6, is formed with an elongated notch 49 of length greater than the width of the widest blank to be received by the magazine to provide a gate 50. At the notch, the front bar 37 is spaced from the bed 21 by more than the thickness of one printed circuit blank but less than twice the thickness of a blank, whereby the lowest of the blanks may be slid therethrough. Since the arrangement of the side bars 33 is variable, like the arrangement of the guides 24 and 26, the spacing between the vertical walls 27 is arranged to be equal to the spacing between the inner vertical walls of the side bars 33. It therefore follows that inasmuch as the guide plates 24 and 26 also extend from the front bar 37, that a blank, when slid outwardly of the magazine through the gate 50, is slid between the guides and precluded from displacement away from the bed by the confining feature of the overhanging portions 28 of the guides. As thus held, the ejected blank is slid to the opposite end of the frame 11. During its transit thereto the movement of the blank is arrested at a printing station in the course C directly under the printing mechanism P.

When a blank is ejected from the magazine M, it acquires considerable momentum owing to the speed at which it is ejected. This would ordinarily create a tendency on the part of the blank to move beyond the ejecting means, later to be referred to, when the ejecting operation is discontinued. Therefore a brake for the blanks is employed. It includes a brake bolt 51, FIG. 8, beside the printing station. Although the bolt 51 may be supported at any convenient point for cooperation with a blank when it reaches the printing station, a desirable position for the brake is between the plate 22 and guide plate 24, the latter being formed with a bolt cavity 52 at its lower side in which the bolt is received. The cavity is of height from the plate 22 approximately equal to the height of the wall 27 with which it communicates by a narrowed channel 53, FIG. 8. The bolt 51 has a narrowed portion or tongue 54 extending through the channel 53 and is biased into the course by a spring 55 confined between the bolt and inner wall of the cavity 52. The movement of the bolt toward the course is limited, however, by engagement of shoulders 56, on the bolt, with stop walls 57 of the cavity. At the course C, the tongue 54 is formed with a brake cam 58 for initial engagement by an ejected blank. As the blank passes over the cam it moves the bolt farther into the cavity against the resistance of the spring 55, an operaion which is accompanied by increased friction between the end of the bolt and blank and also between the latter and guide 26.

Before a printing operation may be performed on a blank, it is desirable that it occupy a predetermined position in the printing station. Therefore clamp means for arranging a blank precisely in a predetermined position in the printing station and for locking the blank in said position, until after a printing operation has been performed, is provided. The means includes a fluid pressure or clamp motor 61, FIG. 7. It is fixed to the lower side of the base plate 19 beside an aperture 62. The motor 61 has a piston rod 63 secured to a clamp cross-head 64 operable in a direction normal to the course in which the blanks pass. In the aperture 62 is mounted a pair of clamp guides or plates 67 and 68 secured in the aperture in superimposed relation to each other by screws 69 passing upward through the plates and threaded in the bed 21, FIG. 9. The upper plate 67 is formed with a pair of wide guide slots 71 directly above a pair of narrow guide slots 72 in the plate 68 to provide T-slots in which a pair of clamp arms 73 of T-shaped cross-section, are slidably received. The arms 73 are bolted to the top of the cross-head 64 in order that they may be moved longitudinally of the slots 71 and 72. From the top of each of the clamp arms 73 a follower or clamp pin 74 extends upward and passes freely through a clearance slot 76, in the bed 21, the slots being parallel to the axis of motor 61. The space between the pins 74 is equal to the space between the notches 3 of the block B. Tips of the pins 74 extend into clearance grooves 77, on the lower side of the guide plate 26, opening into the course C below the ledge 28, so that the pins 74, while normally beside the course of the blanks, may be moved for a short distance into said course to engage with pairs of the notches 3 on one of the blanks. The notches 3 being V-shaped, perform the function of cams for cooperation with the follower pins in order that the blank may be moved backward or forward slightly, if need be, for the blank to be positioned in its predetermined position in the printing station.

Provision for transferring blanks from the magazine to the printing station involves, among other features, formation of the bed 21, FIG. 5, with wide channels 78 on either side of the axis of the bed. The bottom of each channel 78 is symmetrically divided by a narrow channel 79, thereby providing on either side of the channel 79 and at the bottom of the channel 78 seats 81 on each of which an anchor strip 82 is fixed. Each of the strips 82 is of width greater than the width of the seat 81, so that an anchor slot 80 is thus formed which is of inverted T-shaped cross-section. Opening into each of the channels 79 is a clearance slot 86 in which is received a cross-head arm 84 extending upward from a cross-head 87, arranged to move in a clearance aperture or cutout 88 extending longitudinally of the plate 19. To the upper ends of each of the cross-head arms 84 is fixed an ejector rod 83 of complimentary cross-section to the cross-section of the T-slots 80 wherein the rods are slidable. The tops of the rods 83 are substantially flush with the top of the bed 21 and bear in fixed relation thereto, an ejector plate 89, FIG. 2. The plate 89 is slightly narrower than the narrowest blank that the magazine is adapted to receive. The plate 89 has a leading or ejecting edge 91, FIG. 12, square with the course C and arranged to be in a normal position adjacent the stack of magazined blanks just prior to movement of the rods 83 for ejecting a blank from the magazine. The plate 80 is of such a thickness that, when it is carried forward with the rods 83, it may pass freely under the rear wall 41 for the edge 91 to engage the adjacent or trailing edge of the lowest magazined blank without engaging the blank next above.

The plate 89 is arranged to be reciprocated in the course C. This is carried out by a fluid pressure motor or eject motor 92, FIGS. 10 and 11, having a piston rod 93. The motor 92 is supported in horizintal position, by some suitable means rigidly securing the motor to the bottom of the base plate 19. The piston rod 93 is then pinned in a bore 94 axially of a threaded adjustment sleeve 96, FIG. 1. The latter is externally threaded for threaded cooperation with a lug or cross-head extension 97, extending downward from the cross-head 87. By the threaded and consequently adjustable relationship between the piston rod 93 and the cross-head 97 the leading edge 91 of the ejector plate may be extended and retracted with respect to a piston, not shown, of the motor 92. For this to be effected the sleeve 96 has on its end remote from the motor, a boss or wrench-receivable portion 98 by which the sleeve 96 is turned. This is necessary at a time when the machine is set up for performing its printing operation on a different sized blank.

When a blank B is ejected from the magazine M, the lowermost of the magazined blanks is engaged by the ejector plate and pushed out from under the remaining magazined blanks, through the gate 50 and along the course C until its notches 3 are engaged by the pins 74. The ejector plate 89 is long enough to support the remaining magazined blanks when the plate is at the forward end of its stroke, regardless of the size of blanks that are stacked in the magazine. As the ejector plate is moved backward in the course of its return stroke its support for the remaining magazined blanks being removed, they drop to the support of the bed 21, another lowermost blank then taking the place of the one just ejected from the magazine as the edge 91 comes to rest, at the backward end of its stroke adjacent the magazined blanks.

During the return stroke of the ejector plate 89, a printing operation is carried out on the blank just deposited under the printing mechanism P. The sequence in which the ejecting and printing operations are performed is controlled by electrical apparatus to be referred to hereinafter. The ejector rods 83 extend from the plate 89, FIG. 11, toward the station where a blank is printed and are, at their ends, FIG. 10, each formed with a recess 99 in which an ejector dog 101 is pivoted, the dogs being similar to corresponding dogs in the application aforesaid. As such, their free ends extend beyond the ends of the ejector rods 83. Also, the dogs are biased to normally slant upward from their axes below to a level above the top of the bed 21. At the backward end of their stroke, the ends of the dogs are adjacent the trailing end of the blank just stationed under the printing mechanism. Following a printing operation, another blank is ejected from the magazine, as previously described. During this operation, the dogs 101 are carried into engagement with the trailing edge of the blank just printed, which is moved ahead of the rods 83 by the dogs, until the printed blank is moved from the top of the bed. Following removal of the first blank from the bed 21 and concurrent arrangement of another blank under the printing mechanism, the direction of movement of the rods 83 is reversed. During this reversed or backward motion, the dogs 101 engage the leading edge of the blank, now in readiness for printing, which presses the dogs downward against the resistance of their biased status so that the dogs may be carried under the trailing edge of the last-ejected blank just beyond which time the dogs snap upward and are in readiness for removal said last-ejected blank after it has been printed.

The printing mechanism P includes a rectangular screen carrier, plate or swing base 102, FIG. 18. It extends transversely of the frame 11 at one side of which the screen carrier is hinged to the plate 23 by hinge pins 103, FIGS. 17 and 18, passing through pairs of hinge bearings 104, extending downward from the swing frame 102, between hinge bearings 106, extending upward from the plate 23. Normally, the swing frame 102 is also supported from the frame 11 at the opposite side thereof by adjustable feet or screws 107 threaded in two of the corners of said plate, the screws being arranged to rest on the filler plate 22 and when turned to angularly move the swing frame 102 about the hinge pins 103. The swing base 102 is formed with a central, four sided aperture 108, the edges of which are formed with a plurality of lugs 109 each of which is formed with a hole 110 to freely receive a clamp screw 111, FIG. 19, for threaded anchorage in a screen frame 112 below the swing frame 102 to draw the frame against the bottom of swing frame 102. The frame has a screen 113 secured to its lower side in accordance with the disclosure of one of the applications already referred to.

Since the screws 111 which anchor the screen frame 112 to the swing frame 102 are of diameter smaller than the holes 110, the screws permit some edgewise play of the screen frame. Therefore, the swing frame 102 is formed with a plurality of ears 114 extending downward therefrom beside the outer edges of the frame 112. A horizontal locating screw 116 is threaded in each of the ears 114 for pressure engagement with the screen frame so that the position of the latter may be shifted within minute limits before the screws 111 are tightened.

The spacing of the screen 113 from the bed 21 is such that the ejector plate 89 may be moved thereunder, and yet low enough to enable it to be deflected downward into operative engagement with a blank B in the course of a printing operation.

Wiper guides 117, of rectangular cross-section, FIGS. 18 and 19, are fixed to the swing base 102 on their edges, being arranged one at opposite sides of the aperture 108 and to extend transversely of the course C. Upwardly thereof, and on their adjacent sides, the guides 117 are notched at 118, FIG. 19, throughout their length and have fixed to each of their upper edges a cleat 119 to provide with the notch 118 a horizontal guide groove 121. The walls of the grooves 121 afford fixed support for a reciprocatory structure 122 provided by a pair of laterally-spaced spanner bars 123, the respective ends of which are fixed to a pair of bearing blocks 124 received in the grooves 121 for sliding movement therein. Intermediate the spanners 123, and fixed to each of the bearing blocks 124, is a standard 126, the upper ends of which are surmounted by a crown bar 127 fixed to the standards. Those sides of the standards 126 which face each other are formed with vertical channels 128, FIG. 20, the edges of which are overlapped by confining plates 129, fixed to the standards, to provide T-slots 131 in which anchor portions 132, complementary in transverse section to the T-slots of an anchor arm 133, are received. The anchor arms 133 are adjustable longitudinally of the slots 131, and this is due to a vertical adjustment screw 134, FIG. 19, threaded in the crown bar 127. The lower ends of the respective screws, 134 are received in bores 136 in the anchor arms 133, wherein the screws are anchored by cotter pins 137 passing horizontally into the anchor arms and being received in annular grooves 138, on the screws 134, within the bores 136. If desired, a lock nut 135 may be employed on each of the screws 134 to maintain a given setting of the screw when the nut is turned against the crown bar 127.

Both of the anchor arms 133 also afford support for a pair of pintle brackets 139 which are also vertically adjustable with respect to the anchor arms. For this, each of the anchor arms 133 is provided on opposite sides thereof with a vertical clamp groove 141 in which one of the brackets 139 is received for vertical sliding movement. The brackets 139 are each formed with a clamp slot 142, longitudinally thereof, opening into a clamp groove 143, wider than the slot 142, to receive the heads of a pair of clamp screws 144 the shanks of which pass freely through the slot 142 and terminate in end portions 146, of reduced diameter, threaded in the arms 133. From their threaded portions the screws are of adequate length to permit the brackets 139 to move freely in the channels 141, yet retain the brackets in said channels. The elevation of the brackets 139 may be regulated with respect to the anchor arms 133 by elevating screws 147, one of which is threaded in the crown bar 127 above each of the brackets 139. The elevating screws 147 extend into the brackets 139 and are rotatory anchored therein by cotter pin means identical with that described for anchoring the screw 134 to the anchor arms 133.

The brackets 139 provide a suspension for a pair of screen wipers or squeegees 148, FIG. 18. The wipers 148 are made of suitable resilient material, such as rubber, embedded in plates or blades, one of the edges of each of which is pinched in a groove 149 in one edge of a wiper blade support 151 of rigid construction. The supports 151 are similar plate-like structures, each of which is notched at the upper ends thereof at 152 for its accommodation between pairs of the brackets 139. The wipers are retained in this portion by horizontal pintles 153, FIGS. 19 and 21, on either end of the respective supports, which are hooked in pintle notches 154 laterally of the lower end of each of the brackets 139. From the outside of the brackets, the notches 154 extend horizontally then abruptly upward at their inner ends to provide pintle sockets 156 for the pintles and downwardly extending portions 155.

For introducing the wipers 148 into assembly with the brackets 139, the screws 134 and 147 are first moved upwardly. This enables the pintles to be carried into the notches 154 by lateral movement of the wipers 148, the pintles then resting on the bottoms of the notches below the sockets and the rubber wipers being spaced from the screen 113. Then the screws 134 are lowered for the wipers to be brought into pressure engagement with the screen and, if need be, the pressure of the two wipers on the screen is equalized by adjusting one or both of the screws 147 at either side of the screen. During these operations the pintles are moved into the sockets 156 which press downwardly on the pintles to create pressure on the screen by the wipers while the hook portions 155 preclude horizontal displacement of the pintles from the sockets.

Ordinarily, the wipers are at one of the ends of their stroke at which time they are above points sufficiently removed from the course C to enable a blank B to be moved in the course to a point directly under the screen without interference therewith. When, however, the wipers are moved, by means later to be described, from on to the other of their extreme positions, they progressively deflect the screen downward, FIG. 18, into printing cooperation with the blank under the screen which may receive its printing impression during a forward and/or a backward stroke of the wipers.

The means for reciprocating the wipers 148 in their lateral movement includes a fluid pressure screen motor 157, FIG. 18, preferably of the compressed air type. It is rigidly mounted on an arm 158 on the swing frame 102 and in cantilevered relation to the frame 11. The screen motor 157 has a piston rod 159, the external end 161 of which is of reduced diameter for threaded engagement with the nearest spacer 123, a lock nut 160 also being used on the end 161. Means for controlling the operation of the motor 157 and for governing the sequence of its operations with respect to other operations carried out by the machine will be described hereinafter.

It will be apparent that the wipers 148 are arranged to swing about axes provided by the pintles 154. This motion is within limits, and is variable. Means for limiting the motion comprises a stop arm 162 extending upward from either end of the respective wiper blade supports 151 beside the arm 133. A stop screw 163 is threaded in each of the arms 162 and arranged to engage one of the anchor arms 133 as the wipers are rocked about their pintles 154. While the stop screws 163 limit rocking of the wipers in one direction, by their engagement with the arms 133, they alone, are incapable of providing a limitation to rocking of the wipers in the opposite direction. Therefore, a pair of strikers 164, FIGS. 17 and 18, from either end of the respective wiper blade supports 151, the strikers being formed to substantially span the space between the supports 151 so that their free tips 166 may have rubbing engagement with the other of the supports 151. If desired, the tips 166 may have a radius thereon at the frictionally engaged support to facilitate smoothness of their cooperation with said frictionally engaged support.

In operation, as the screen motor 157 moves the wipers 148 forward, their lower edges dragging against the screen 113, the wipers bend longitudinally thereof slightly and ink, on the screen between the wipers, wedging between the lower ends of the wipers and screen, is pressed through the latter and onto the blank thereunder. Also, the screen being stencilled, a printed impression is imparted to the blank. During this operation the stop screws 163, nearest to the piston rod 159, engage the anchor arms 133. When the motion of the piston rod reversed, the stop screws on the opposite sides of the arms 133 are swung into engagement with said arms as the first referred to pair swing out of engagement therewith, the drag of the wipers on the screen being responsible for another printing operation as said wipers are deflected in the opposite direction.

Care is taken to minimize the degree to which the bed 21 is offset relative to the tops of the guide plates guides 24 and 26, since sharp edges on the adjacent upper edges of the guide plates ordinarily would have a tendency to exert undue pressure on the screen and thereby reduce its life. Therefore, the thickness of the guide plates 24 and 26 tapers transversely thereof toward their adjacent edges, as indicated at 30, FIG. 8.

As has been previously indicated, the swing frame 102 is hinged at one side thereof to an edge of the frame 11. The purpose of this feature is to carry the screen 113 and other elements of the printing mechanism away from the frame 11 and expose the lower side of the swing frame 102 for changing or cleaning the screen 113.

Figure 4:
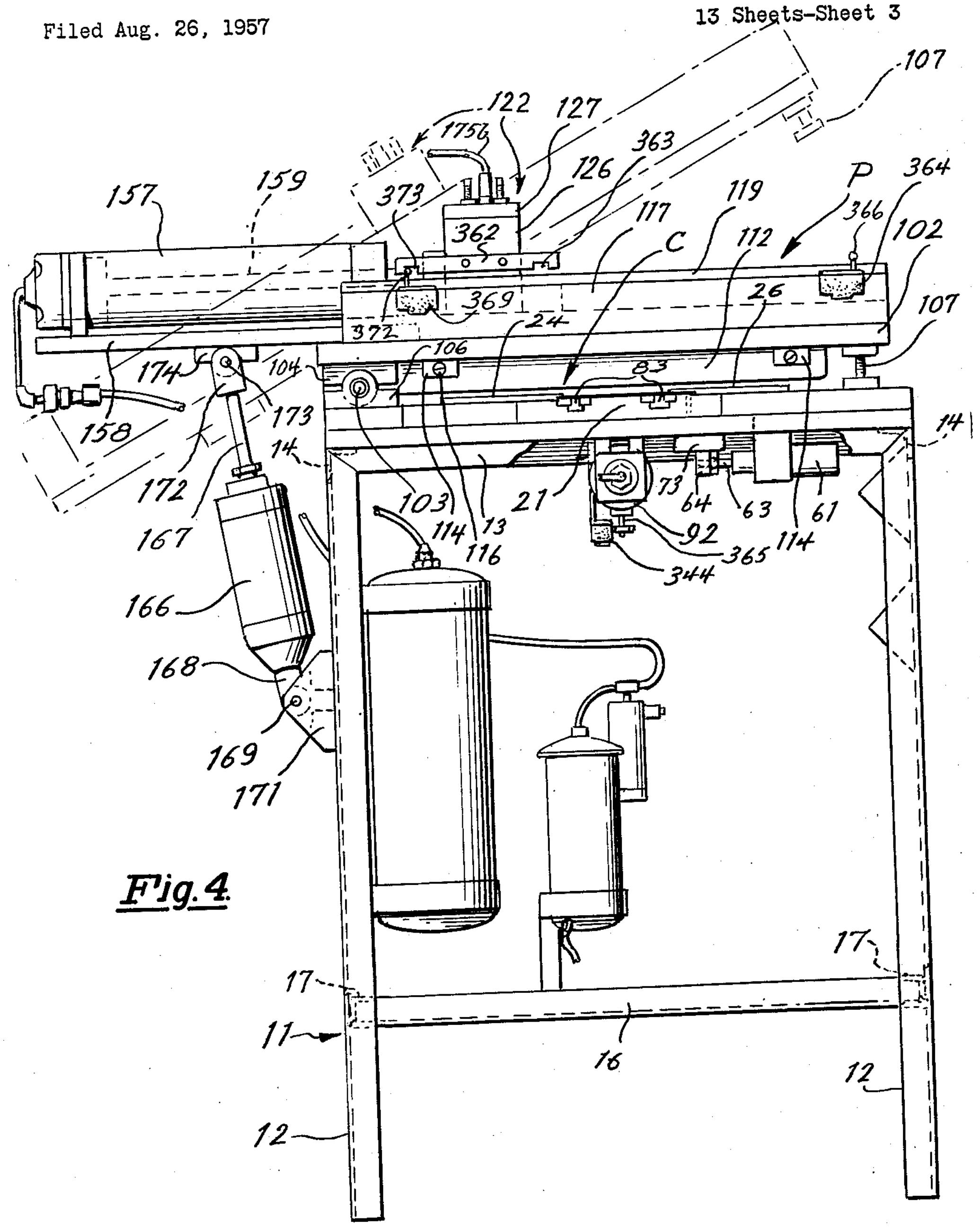
FIG. 4 shows, in elevation, the machine depicted in FIGS. 1 and 2, as viewed from the left thereof, parts thereof being broken away.

The printing mechanism P is arranged to be tilted about the hinge pins 103 by operation of a tilt motor 166, FIG. 4, also of the fluid pressure variety. It is arranged with its axis inclined slightly from a vertical position, has a piston rod 167 protruding from its upper end, while its lower end bears an ear 168 pivoted at 169 to a bracket 171 on the frame 11. The piston rod 167 bears a bifurcated member 172 through which a pivot pin 173 passes to couple the member 172 to a tilt bracket 174 on the arm 158. When the motor 166 is operated to move its piston rod in a downward direction the printing mechanism P is swung counterclockwise about its axis provided by the pins 103. After the screen has been changed or cleaned the printing mechanism is allowed to return to its horizontal position by gravity, the operation of the piston rod being controlled by means to be described hereinafter.

For conveying ink to the screen 113, a pipe 175, FIG. 19, supported in a vertical position by the crown bar 127, extends downward to a horizontal tube or ink rail 175*a* between the wipers 148. The pipe 175 receives ink from some suitable source by way of a flexible conduit 175*b*, in communication with the pipe, above the crown bar 127 from which the ink passes to the rail 175*a* the lower side of which is formed with a series of orifices 175*c* through which the ink is exuded for dissipation by the wipers.

In the embodiment depicted in FIGS. 17 and 18 a pair of guide plates 24′ and 26′ of cross-section similar to each other, and their counterparts 24 and 26 of the previously described embodiment, are provided. They are supported from the top of a bed 21′ where they extend from a magazine M′ to the opposite end of the bed. The position of the member 24′ is fixed with respect to the bed 21′ while the member 26′ is variable laterally to severally accommodate between it and the member 24 blanks differing in width. Means for releasably clamping the member 26′ to the bed 21′ comprises a plurality of spaced-apart parallel anchor slots 279, FIG. 19, extending in a direction normal to the guide plate 24′. Each of the slots 279 is wide enough to accommodate therein the shanks of a pair of clamp screws 281 after the screws have also passed through the plate 26′. Opposite edges of each slot 279 are in overhanging relation to a channel 282, in a base plate 19′, in which an anchor member or nut 283 is slidably received to in turn afford threaded cooperation with the screws 281 for clamping the plate 26′ to the bed 21′. The width of a course C′ for blanks B to pass in is therefore variable relative to the guide member 24′.

The width of the magazine M′ is also variable to accommodate blanks in stacks varying in width. In order that it may have this feature the magazine comprises a fixed side bar 33′ and an adjustable side bar 33″. While the side bar 31′ is fixedly secured to the bed 21′, the bar 33″ is releasably anchored thereto so that the latter bar may be moved laterally relative to the bar 33′. Responsible for this function is a plurality of rows of threaded holes 287, FIG. 22, extending transversely of the bed below the adjustable bar 33″. The adjustable bar 33″ is formed with a countersunk slot 288 above each of the row of holes 287 to freely receive a screw 289 which is anchored in one of the holes 287 selected in accordance with the width of blanks to be received between the side bars. In locating the adjustable bar 33″, prior to tightening the screws 289, the gauge plate 25*a* is preferably employed by positioning one of its longitudinal edges in abutment with the bar 331 and then moving the adjustable bar 33″ into abutment with the opposite longitudinal edge of the gauge plate, no use being made of the holes 25*b* therein. Then the screws 289 are tightened and gauge plate removed. The magazine M′ also includes a front bar 37′ which is in front of the side bars 33′ and 33″ and is fixed at both of its ends to the bed 21′. The rear bar 39′ is superimposed on the side bars 33′ and 33″ to which it may be clamped in a variety of positions varying in their spacing from the front bar 37′. Responsible for this is a longitudinal groove 42′, in the outer side of both side bars 31′ and 33″, with which a flanged nut 44′ is cooperatively associated as in the previously described magazine, and a screw 47′ is threaded in each of the nuts 44′. At the fixed bar 31′, the screw 47′ passes freely through a hole 297, FIG. 22, in the bar 39′; at the side bar 33″ the screw passes freely through a slot 298 in the rear bar 39′. When the screws 47′ are loose, the rear bar 391 may be moved along the side bars to a position selected to accommodate a given stack of blanks between the front and rear bars. Then the screws 47′ are tightened. As indicated in FIG. 22, the lower portions of the rear bar 39′ are undercut at 299 and 301 from their ends, that end overlying the adjustable bar 33″ being for a distance greater than from the opposite end to allow shifting of the side bar 33″ thereunder. The remaining portion of the rear bar between the undercuts extends downward to within twice the thickness of a blank B, but less than the thickness of one blank from the bed 21′ so that an ejector plate 89′ of thickness slightly less than the thickness of a blank may pass under the rear bar 39′ to eject a blank from the magazine. This, of course, must take place under the front bar 37′. But since the latter rests on the bed 21′, the front bar is undercut, centrally thereof, at 303 for a distance greater than the widest blank to be magazined thereby to provide a gate 50′ slightly higher above the bed 21′ than the thickness of a blank, but less than twice the thickness of a blank. This enables the ejector plate 89′ to pass the lowest magazined blank through the gate 50′. Each of the bars 37′, 39′, 33′, and 33″ bears at least one vertical rod 48′ for collectively providing a fence structure to confine a stack of the blanks against lateral displacement when the stack is higher than the side and front bars of the magazine.

Unlike the embodiment of the invention first described, the ejector plate 89' is attached to a single ejector rod 83' only. It is of inverted T-shaped cross-section and retained in a T-slot 80' provided by means including spaced apart anchor strips 82', as shown in FIG. 22.

In order to understand the means employed for controlling the operations of the several fluid motors, already referred to, and for determining the sequence of their operations, it should be noted that each of the motors, with the exception of the motor 61, has a double solenoid-operated two-way valve in combination therewith. These valves, of course, are for alternately admitting fluid under pressure such as air to opposite sides of a piston in each of the motors, the side of a piston to which pneumatic pressure is applied being governed by the setting of the associated valve. Operation of the valves is in repsonse to alternate energization of one of a pair of solenoids associated as a unit with each of the valves, the magazine motor 92 having a unit 311, FIG. 23, the wiper motor 157 having a unit 313, the tilt motor 166 having a unit 317 and the motor 61 having a unit 318 associated therewith. One of the leads of the respective solenoids is grounded. The purpose of the remaining leads of the respective solenoids will be indicated hereinafter.

For operation of the foregoing two-way valves, an alternating electric current from any convenient source, is conveyed by a pair of conductors 321 to a transformer 322, which steps the current down to a low voltage of preferably 8 volts. One side of the transformer is grounded and the other side is connected to the center blande 323 of a single pole, double throw switch 326 by a lead 324. The switch may be set for in an "automatic," a "manual," or a "neutral" position. When in the up or "automatic" setting, as indicated in FIG. 23, the switch 326 conveys current to control apparatus elements which are energized in response to movement of other elements so that a complete printing cycle is carried out automatically and then repeated indefinitely, the cycle involving ejecting of a blank from the magazine, operation of the gripper pins 74, and movement of the wipers 148 from one to the other of their extreme positions at opposite edges of the screen. When the switch 326 is in its down or manual setting, the last three mentioned operations take place only when other switches are manually and severally operated. In its neutral position the circuit is broken.

Assuming that the switch 326 is in its neutral position, and that the ejector plate 97 is in its extreme position to the right of the magazine M, as indicated in FIG. 12, the gripper pins 74 are then out of the course C and wipers 148 are in one of their extreme positions. If the handle 323 of the switch 326 is now moved up from its neutral to its automatic position, current from the wire 324 may flow to a wire 327. Then a pair of solenoids 328 and 329 are energized, since one of their respective ends is grounded while their remaining ends are connected by the wire 327 and a wire 331 to the switch 326. Consequently, a pair of switches 334 and 336, controlled by the solenoid 328, is closed, as is a pair of switches 337 and 338 controlled by the solenoid 329.

Then a normally-open switch 339 is manually momentarily closed. This enables current to flow from the hot wire 327 through the wire 341, and one side of the switch 339, to a wire 343, which energizes one of the solenoids 311 that is responsible for movement of the piston rod 93 to the left to carry out a blank ejecting operation; the setting of the valve operated by the solenoid remains unchanged throughout the ejecting stroke. As the piston rod 93 moves to the left, the switch 359 opens and as it approaches the end of its ejecting stroke it closes a normally open limit switch 344, one side of which is connected by a wire 346 to the hot wire 341. This enables current to flow by way of wires 347, 348, switch 337, and wire 349 to that one of the solenoids 318 which is responsible for movement of the gripper pins 74 from their positions beside the course C into said course and into cooperation with the notches 3 of a blank B, as previously indicated.

At this point, it should be noted that a switch 351 although normally open, is retained in closed position by pressure of a bar or switch cam 352 fixed to one side of the reciprocatory structure 122.

With closing of the limit switch 344 current flow through the switch 336, a wire 353, switch 351 and a wire 354 connected to that one of the solenoids 313 which is responsible for movement of the wipers 148 forward or away from a first of their extreme positions, thereby allowing the switch 351 to open. During a continuation of this forward stroke of the wipers 148 the blank held by the gripper pins 74 is printed. At the end of its forward stroke the switch cam 352 closes a normally open limit switch 356, one pole of which is connected to the wire 353 and conditioning the circuit for current flow from the wire 353 over a wire 357 to the other of the solenoids 313 which is eventually responsible for a return stroke of the wipers 148. Concurrent with this, a current flows through that one of the solenoids 311 responsible for the return stroke of the piston rod 93, said solenoid being energized by a current passing therethrough from the switch 334 and over wire 358. As the piston rod 93 starts its return stroke, it releases the limit switch 344, allowing it to open. Then at the end of its return stroke the piston rod 93 closes a second normally open limit switch 359, one side of which is connected to the hot wire 346 by a wire 345, and the other side connected to a wire 361. As a result, there is a flow of current through the switch 338 over a wire 360 to that one of the solenoid coils 318 which is responsible for retraction of the pins 74 from the now-printed blank and course C.

Both of the limit switches 344 and 359 are supported from the bottom of the plate 19 by a longitudinal bracket 355 and are operated by a finger 365 carried by the cross-head extension 97.

As already indicated, the start switch 339 is closed but momentarily to initiate a printing cycle. Hence, the start switch 339 is open when a cycle is completed. Therefore, for one cycle to be automatically followed by another cycle and for the cycles to be continuous, other switch means operable automatically in lieu of the switch 339 are provided. The switch means are arranged to be actuated by some moving part or parts of the machine, when moved to a predetermined point during a cycle. Desirably, the switch means may be operated indirectly by the wiper motor 157 when it has moved the wipers near to one of their extreme positions. Accordingly, a second cam or switch bar 362 is fixed to the reciprocatory structure 122 on the side thereof opposite the cam bar 352. The bar 362 is formed with a notch 363 near a switch 364 when the structure 122 is in its second extreme position. A finger 366 on the switch 364 is engaged and displaced by the cam bar 362 when the latter is in close proximity to its second extreme position, thereby closing the switch 364. When the cam bar has reached its second extreme position the notch 363 has been carried to a point where it receives the finger 366 which snaps into the notch 363 to open the switch. As a result, the movable structure 122 comes to a stop in its second extreme position. The stop of cams 362 and 352 is momentary, however, for by the time the switch 364 closes, the piston rod 93 has reached the return end of its stroke and has closed the switch 359.

It will be noted that the operation of the wiper occurred after the rod 93 had moved to the left and closed the switch 344. The switch bar 362 immediately started the rod 93 to the right while the wiper was traveling across the screen. The movement of the rod 93 to the right opened the switch 344 which supplied current to the wiper motor solenoid 313 and although that circuit is now in condition to operate the wiper on a return stroke this does not occur until the switch 344 is closed the next time. Thus the wiper operates first in one direction for one complete stroke of the rod 93 and in the other direction for the next complete stroke. A circuit is then reestablished through the eject solenoid 311 by way of the wire 341, switch 364, a wire 367, a wire 368, and the wire 343, whereupon another blank is ejected from the magazine M. The operations just described for carrying out a printing cycle are now repeated with the exception of the operation of the cam bars 352 and 362 which now move in the opposite direction; that is, from their second extreme position to their first extreme position. To understand the reasons for this, it should be remembered that the switch 356 is closed by the cam bar 352 when the latter is in its second extreme position and concurrently the switch 351 is open. Therefore, as switch 344 closes, as the piston rod 93 reaches the end of its ejecting stroke, that one of the solenoids 313, which governs the return stroke of the wipers 148, is energized whereupon the wipers move backward toward their first extreme position. Concurrently, the piston rod 93 is moving to the right to close the switch 359. This takes place prior to closing of a micro switch 369 by the cam bar 362, so that when the last-named switch is closed a current may flow from the hot wire 341 by a wire 371 to the wire 368 connected to the solenoid 311 by the wire 343 to initiate another cycle of the motor 92. As the cam bar 352 is returned to its first extreme position, switch 351 is closed, as previously indicated, while the switch 369 opens, its closing being momentary or only long enough to restart a cycle. The switch 369 is closed but momentarily due to a finger 372 thereon in the course of the movable cam bar 362, which has a notch or cam dwell 373 arranged to receive the finger when said structure is in its first extreme position. When the finger 372 is in the notch 373, the switch 369 is open. Before this status is reached, however, the finger is engaged and moved by the cam bar 362 to close the switch and so retain said switch until the notch 373 is carried to a point opposite the finger.

The automatic controls having now been described, an explanation of the means for normally controlling the several operations separately will now be set forth. The manual means includes a series of manually operable and normally open switches 374, 376, 377, 378, 379, 381, 382, and 383, one of the poles of each of which is connected to a wire 384, as indicated. When the setting of the switch 326 is changed from "automatic" to "manual" current may flow from the wire 324 to the wire 384 and through whichever of the switches 374–383 that is closed. At the same time that the switch 326 is changed from "automatic" to "manual" control, current is diverted from the solenoids 328 and 329. Hence, the switches 334, 336, 337, and 338 open. A blank may now be ejected from the magazine M by momentarily closing the switch 376. This provides a circuit from the wire 384 over a wire 386, connected to the wire 343, and to that solenoid 311 serving to initiate movement of the piston rod 93 to the left. The piston rod 93 is moved to the right from its extreme position at the left by closing the switch 374 thereby to provide a circuit through the other of the solenoids 311 by way of a wire 387 connected to the wire 358. The wipers 148 may be moved between their extreme first and second positions by depressing the switch 378. To understand how this is possible it should be remembered that once started in one of their strokes across the screen, the wipers 148 do not stop until they are in one of their extreme positions. Illustrative of this, and assuming that the wipers are in their first extreme positions, from which it is desired to move them by manual control, an operator closes the switch 378 allowing a current to flow from the wire 384 by way of wires 388, 353, switch 351, and wire 354 to that solenoid coil 313 responsible for movement of the structure 122 away from its first extreme position. Once the wipers 148 are in their second extreme position, closing the switch 378 also has the effect of initiating movement of the wipers away from their second extreme position, since the switch 356 being closed and the one 351 open, the current follows a course from the wire 353 through the switch 356, and by way of lead 357 to that one of the solenoids 313 which initiates the return stroke of the motor 157. In order to swing the screen 113 upward about the pins 103, FIG. 18, an operator would close the switch 381, FIG. 23, to provide a circuit from the hot wire 384 by way of a wire 392 and to that one of the solenoids 317 which is responsible for swinging of the printing mechanism P in a counterclockwise direction about its axis, FIG. 4. For swinging the screen in the opposite direction, the switch 379 would be closed to provide a course through the other of the solenoids 317 by way of a wire 394.

The locating pins 74 are extended into the course C by closing the switch 382. This creates a circuit from wire 384 over a wire 397 connected to the wire 349 for operating that one of the solenoids 318 responsible for extending the pins. Another circuit is made through the other of the solenoids 318 by closing switch 383 to provide a course for flow of current by way of a wire 399 to the wire 360 and the remaining solenoid 318 for retracting the locating pins.

Having described herein our invention in two embodiments, thereof, we are aware that numerous and extensive departures may be made therefrom without departing from the spirit or scope of the appended claim.

We claim:

A printing mechanism comprising a horizontal bed, a pair of guides fixed to the bed, said guides being spaced to provide a course therebetween for a rectangular plate-like blank to slide in over said bed, said blank being formed with a notch at one of its edges, a reciprocated ejector member for rapidly moving the blank substantially to a predetermined position in the course during its forward stroke, a friction augmenting member, said last-named member being arranged to engage said blank adjacent said position and reduce its momentum on reversal of movement of said ejector member by increasing the frictional resistance offered said blank by said course adjacent said predetermined position, and a clamp member normally beside the course at said predetermined position and being arranged to be moved laterally into the course to engage the notch for indexing the blank accurately into said predetermined position and for clamping said blank in its predetermined position while a printing operation is performed on said blank.

References Cited in the file of this patent

UNITED STATES PATENTS

| | | |
|---|---|---|
| 1,029,159 | Westerbeck | June 11, 1912 |
| 1,078,281 | Hay | Nov. 11, 1913 |
| 1,095,126 | Rogers et al. | Apr. 28, 1914 |
| 1,731,834 | Wheeler | Oct. 15, 1929 |
| 1,841,488 | Liss | Jan. 19, 1932 |
| 2,448,303 | Fors | Aug. 31, 1948 |
| 2,474,944 | Henry | July 5, 1949 |
| 2,548,119 | Pembroke | Apr. 10, 1951 |
| 2,565,054 | Watrous | Aug. 21, 1951 |
| 2,610,579 | Wing | Sept. 16, 1952 |
| 2,681,004 | Freeborn | June 15, 1954 |
| 2,688,917 | Reinke | Sept. 14, 1954 |
| 2,729,162 | Edelberg et al. | Jan. 3, 1956 |
| 2,810,340 | Saunders | Oct. 22, 1957 |
| 2,846,946 | Schwartzberger | Aug. 12, 1958 |